United States Patent [19]

Dias

[11] 3,732,441

[45] May 8, 1973

[54] SURFACE WAVE INTEGRATABLE FILTER FOR COUPLING A SIGNAL SOURCE TO A LOAD

[75] Inventor: Fleming Dias, Palo Alto, Calif.

[73] Assignee: Zenith Radio Corporation, Chicago, Ill.

[22] Filed: May 7, 1971

[21] Appl. No.: 141,322

[52] U.S. Cl. ....................307/295, 333/80 T

[51] Int. Cl. ....................H03h 7/44

[58] Field of Search ....................333/72, 80 T; 331/8; 328/167; 307/295

[56] References Cited

UNITED STATES PATENTS

| | | | |
|---|---|---|---|
| 3,581,248 | 5/1971 | DeVries | 333/72 |
| 3,483,477 | 12/1969 | Purnaiva | 333/80 T |
| 3,384,844 | 5/1968 | Meacham | 333/80 T |
| 3,397,363 | 8/1968 | Dias | 333/80 T |
| 3,267,397 | 8/1966 | Skinner | 333/80 T |
| 3,581,123 | 5/1971 | Pest | 333/80 T |
| 3,599,008 | 8/1971 | Popiel | 333/80 T |
| 3,364,435 | 1/1968 | Hurtig | 333/80 T |
| 3,343,003 | 9/1967 | Arseneau | 333/80 T |
| 3,414,824 | 12/1968 | Weidmann et al. | 307/295 |
| 3,152,309 | 10/1964 | Bogusz et al. | 333/80 T |

*Primary Examiner*—John W. Huckert
*Assistant Examiner*—R. E. Hart
*Attorney*—John J. Pederson and John H. Coult

[57] ABSTRACT

A surface-wave integratable filter includes spaced input and output transducers on a surface of a piezoelectric substrate. The input transducer responds to signals from a source for launching acoustic surface waves in the substrate. The output transducer responds to the acoustic surface waves to develop an electrical signal for application to a load. Each transducer presents a predetermined clamped capacitance and a pair of transistors are included in the filter to compensate that capacitance. Each transistor has input and output signal circuits with an assigned one of the transducers coupled into its input signal circuit. Impedance means, common to the input and output signal circuits of each transistor, controls its operation to present, in parallel with its assigned transducer, an inductive reactance which at the frequency of the signals is substantially equal to the reactance of the clamped capacitance of its associated transducer.

1 Claim, 3 Drawing Figures

PATENTED MAY 8 1973 3,732,441

Inventor
Fleming Dias
By Francis W. Crotty
Attorney

SURFACE WAVE INTEGRATABLE FILTER FOR COUPLING A SIGNAL SOURCE TO A LOAD

BACKGROUND OF THE INVENTION

The present invention pertains to surface-wave integratable filters. More particularly, it relates to acousto-electric filters of a solid state nature.

It is known that a transducer composed of an electrode array, having interleaved combs of conducting stripes or teeth at alternating electric potentials, when coupled to one portion of a piezoelectric medium, produces acoustic surface waves on the medium which propagate away from the transducer. Those waves are converted back to an electrical signal by a similar array of conducting stripes coupled to another portion of the piezoelectric medium. Such a device affords selectivity with respect to particular frequencies or frequency ranges, and that selectivity may be tailored by appropriate modifications of the structure. Such modifications and other variations are discussed in detail in the co-pending application of Adrian J. DeVries, Ser. No. 721,038, filed Apr. 12, 1968, now U.S. Pat. No. 3,582,838 and assigned to the same assignee as the present application.

The transducer arrays individually present a clamped capacitance which is that capacity associated with or exhibited by the arrays when the medium is physically clamped to inhibit surface waves. In some applications, an inductor or coil has been connected across each transducer in order to achieve more appropriate impedance matching and for the purpose of tuning out the clamped capacitance. As described in the aforementioned co-pending application, variation of the inductance of such coils provides a convenient parameter for assisting in the shaping of frequency response, although that adjustment may be incompatible with adjustment to tune out the clamped capacitance. However beneficial, the use of such coils is often not desirable because of their bulky nature, the coils perhaps needing to be considerably larger than the remainder of the surface-wave filter. They also are undesirable in that they do not lend themselves to monolithic form and require separate assembly by an operator, whereas the remainder of the surface-wave device may be fabricated by the use of techniques known for the formation of integrated circuits.

It is, therefore, a general object of the present invention to provide a new and improved surface-wave integratable filter which incorporates an inductive effect for compensating or tuning the clamped capacitance while yet avoiding the aforenoted undesirable features.

Another object of the present invention is to provide a new and improved surface-wave integratable filter which includes desired inductance and yet is capable of being manufactured entirely by the use of integrated circuit techniques.

A surface-wave integratable filter, constructed in accordance with the present invention, couples a signal source to a load and includes a piezoelectric substrate propagative of acoustic waves. An input transducer, having a certain clamped capacitance and composed of a pair of interleaved combs of conductive electrodes mechanically coupled to a surface of the substrate, responds to signals from the source and launches acoustic surface waves in the surface. An output transducer, likewise having clamped capacitance and composed of a pair of interleaved combs of conductive electrodes mechanically coupled to a portion of the substrate spaced from the location of the input transducer, responds to the acoustic surface waves to develop an electrical signal for application to the load. A transistor is included in the filter and has input and output circuits, one of which includes one of the transducers. An impedance means, common to the input and output signal circuits of the transistor, controls the operation of the transistor to present, in parallel with the associated transducer, an inductive reactance at the frequency of the signals. In one embodiment, the inductive reactance is substantially equal to the reactance at that frequency of the clamped capacitance of the one transducer.

The features of the present invention which are believed to be novel are set forth with particularity in the appended claims. The invention, together with further objects and advantages thereof, may best be understood, however, by reference to the following description taken in conjunction with the accompanying drawing, in the several figures of which like reference numerals identify like elements, and in which:

Figure 1:
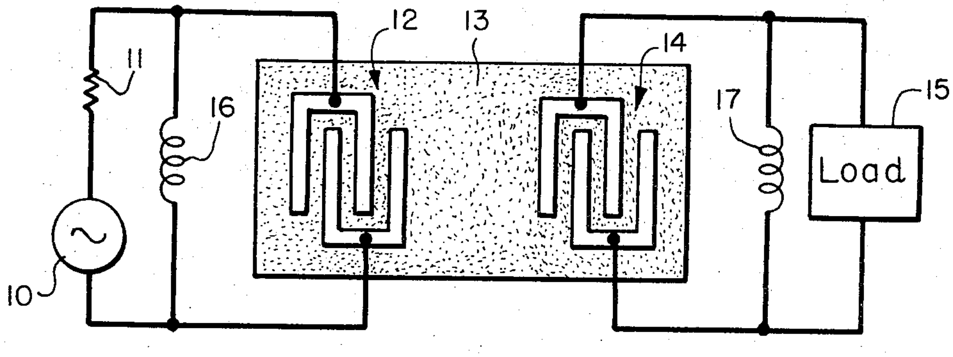
FIG. 1 (PRIOR ART)
FIG. 1 is a diagram of a known surface-wave integratable filter.

FIG. 1 illustrates a surface-wave integratable filter of a kind described in detail in the aforesaid co-pending application. A signal source 10 in series with a resistor 11, which may represent the internal impedance of source 10, is connected across an input transducer 12 mechanically coupled to one portion of a major surface of a body of piezoelectric material or substrate 13 which serves as an acoustic-surface-wave propagating medium. An output or second portion of the same surface of substrate 13, remote from the location of input transducer 12, is mechanically coupled to an output transducer 14 across which a load 15 is coupled.

Transducers 12 and 14 in this simplest arrangement of an acoustic-wave filter system are identical and are individually constructed of two comb-type electrode arrays. The conductive teeth of one comb are interleaved with the teeth of the other. The combs are of a material, such as gold or aluminum, which may be vacuum deposited on a smoothly lapped and polished planar surface of the piezoelectric body or substrate 13. The piezoelectric material is one, such as PZT, quartz or lithium niobate, that propagates acoustic surface waves. The distance between the centers of two consecutive teeth in each transducer is one-half of the acoustic wavelength in the piezoelectric material of the signal wave for which it is desired to achieve maximum response.

Direct piezoelectric surface-wave transduction is accomplished by the spatially periodic interdigital electrodes or teeth of transducer 12. A periodic electric field is produced when a signal from source 10 is fed to the teeth and, through piezoelectric coupling, the electric signal is predominantly transduced to a traveling acoustic wave on substrate 13. This occurs when the stress components produced by the electric field in the substrate are substantially matched to the stress components associated with the surfaced-wave mode. Source 10, for example, the radio-frequency portion of the tuner of a television receiver, produces a range of signal frequencies, but due to the selective nature of the arrangement only a particular frequency and its intelligence carrying sidebands are converted to acoustic surface waves. Those surface waves are transmitted along the substrate to output transducer 14 where they are converted to an electric signal for application to load 15 which in this example may be a subsequent radio-frequency stage of the aforementioned tuner.

In a television tuner embodiment, utilizing a lithium niobate substrate, the teeth of both transducers 12 and 14 are each about 4 microns wide and are separated by a center-to-center spacing of 8 microns for the application of a radio frequency signal at 211.25 megahertz. The spacing between transducers 12 and 14 in that example is on the order of 60 mils and the width of the wavefront is approximately 0.1 inch. This structure of transducers 12 and 14 together with substrate 13 can be compared to a cascade to two tuned circuits with a resonant frequency of approximately 211 megahertz, the resonant frequency or frequency of maximum response being determined, at least to a first order, by the spacing of the teeth.

The potential developed between any given pair of successive teeth in transducer 12 produces two waves traveling along the surface of substrate 13 in opposing directions, perpendicular to the teeth for an isotropic substrate material. When the center-to-center distance between the teeth is one-half of the acoustic wavelength of the wave at the desired frequency, relative maxima of the output waves are produced by piezoelectric transduction in transducer 12. For increased selectivity, additional electrode teeth may be added to the comb patterns of transducers 12 and 14.

Also connected across input transducer 12 is an inductance or coil 16, while a similar inductance or coil 17 is connected across output transducer 14 in parallel with load 15. Coils 16 and 17 are for matching purposes and are added to tune with the clamped capacitance of the respective transducers. The clamped capacitance, as stated above, is a capacitance associated with or exhibited by transducers 12 and 14. It is governed by the geometrical size and distribution of the teeth and the dielectric constant of the piezoelectric material and, as such, represents the capacitance of the transducers when they are clamped for surface waves. Inductance variations of coils 16 and 17 provide a convenient parameter for shaping the responses of transducers 12 and 14. The Q's of the tuned circuits should be small compared to the effective Q of the acoustic filter so that variations in clamped capacitance do not affect the response more than can be tolerated and the selectivity is determined predominantly by the acoustic element. Thus, a lossy inductor is desirable.

Figure 2:
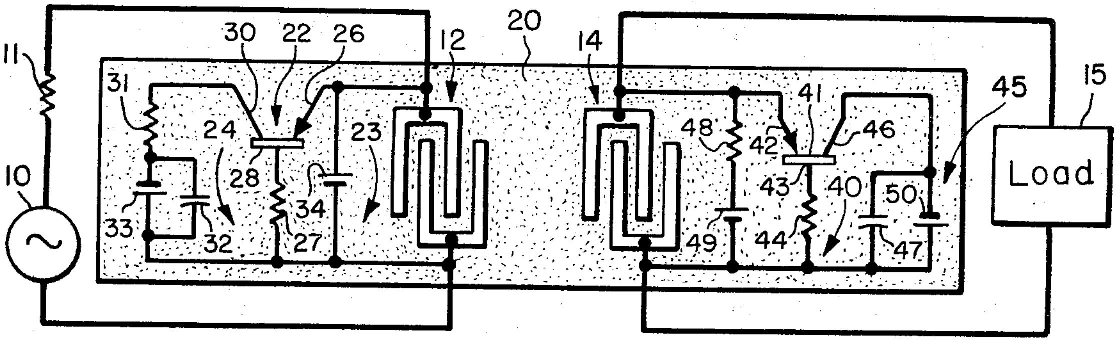
FIG. 2 is a diagram of a modified form of surface-wave integratable filter.

In FIG. 2, a surface wave integratable filter again includes source 10 and its internal impedance 11 coupled across input transducer 12 which is located on a piezoelectric substrate 20 which propagates surface acoustic waves. Also, output transducer 14 is similarly mounted on substrate 20 and coupled across load 15. So far as operation of the filter itself is concerned, acoustic surface waves are launched by input transducer 12 and converted back to electrical signals by transducer 14 in the same way as described with respect to the filter of FIG. 1.

Associated with input transducer 12 is a transistor 22 that has an input signal circuit 23 and an output signal circuit 24. Input transducer 12 is coupled in series in input circuit 23. Thus, the input signal path extends from an emitter 26 through transducer 12 and a resistor 27 to the base 28 of transistor 22. The output signal path extends from a collector 30 through a load resistor 31 and a bypass capacitor 32 through resistor 27 to base 28. Collector 30 is back-biased by a direct-current source 33 connected between resistors 27 and 31, while emitter 26 is forward-biased by a DC current source 34 connected directly between emitter 26 and the same end of resistor 27. Resistor 27 constitutes an impedance that is common to both input and output circuits 23 and 24. Resistor 27 controls the operation of transistor 22, as explained more particularly hereafter, so that the transistor presents an inductive reactance in parallel with transducer 12.

While transistor 22 is illustrated as of the three-terminal type, it may be replaced by a tetrode transistor operating as described in my prior U. S. Pat. No. 3,397,363. Particularly in view of that disclosure, it will be observed that resistor 27 should be considered as including the intrinsic base resistance of the transistor itself. When using such a tetrode transistor, the magnitude of the simulated inductive reactance is a function of changing the current between its two bases. In any event, the effective inductance has a reactance at the frequency of the signals from source 10 that may be substantially equal to the reactance at that frequency of the clamped capacitance presented by transducer 12. This is preferred if the transistor is employed simply to tune out the clamped capacitance. Those transistors usually accepted as low-frequency devices are most useful in establishing the desired inductive effect. In use at higher frequencies, as herein contemplated, they exhibit transit-time effects that give rise to the vector diagram of FIG. 3.

Figure 3:
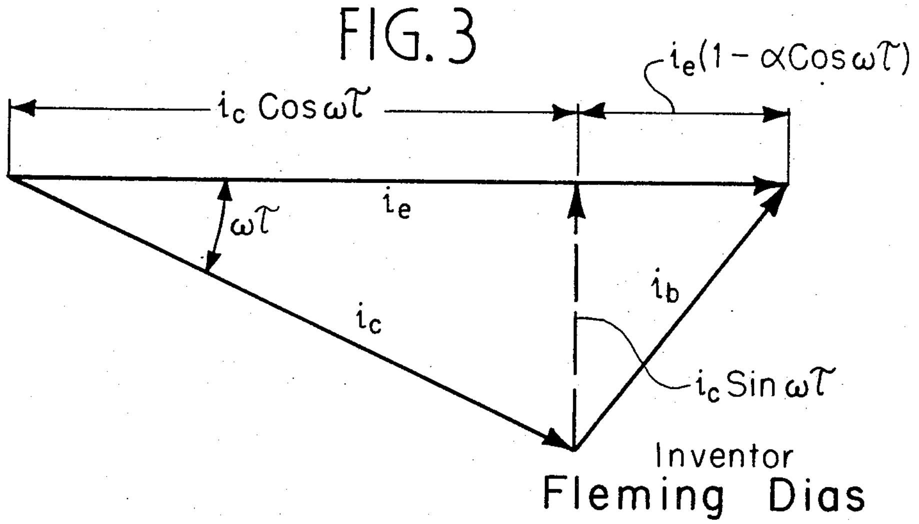
FIG. 3 is a vector diagram useful in explaining the operation of the filter of FIG. 2.

In FIG. 3, the relationships between the different transistor signal currents are defined by the triangle formed by vectors respectively representing the base current $i_b$, the emitter current $i_e$ and the collector current $i_c$. The angle between vectors $i_e$ and $i_c$ is equal to the quantity $\omega\tau$, where $\omega$ is the radian frequency of the signal from source 10 and $\tau$ is time. The normal component of the base current can be expressed by the vector $i_c \sin \omega\tau$.

With transistor 22 having a current gain $\alpha$, the ratio of emitter to base currents, the normal component of base current $i_b$ may equivalently be expressed by the relationship:

$$|\alpha|\, i_e \sin \omega\tau \qquad (1)$$

Consequently, the reactive component of the voltage developed across the common base impedance presented by resistor 27 is given by the expression:

$$i_b R_b |\alpha| \sin \omega\tau \qquad (2)$$

where $R_b$ is the value of resistor 27 (including the intrinsic base resistance). From equation (2) it may be seen that the reactance presented across resistor 27 is represented by the expression:

$$i_e R_b |\alpha| \sin \omega\tau \quad (3)$$

Accordingly, the equivalent inductance $L$ of that reactance is obtained by dividing that reactance by the radian frequency, or:

$$L = R_b |\alpha| \sin \omega\tau/\omega \quad (4)$$

Utilizing conventional transistors, the arrangement simulates an inductor of the order of eight microhenries and exhibits a Q of about 5. While higher inductance values and higher Q's might be obtained from the circuitry in question, the usual objective here is that of a comparatively low Q so that selectivity will be determined primarily by the acoustic elements. The total impedance presented to transducer 12 by the transistor circuitry is then equal to $$Z_{in} = r_e + j\omega L \quad (5)$$

where $r_e$ is the emitter resistance.

More particularly relative to the Q of the arrangement, FIG. 3 permits a further understanding of the relationships involved. The in-phase component of the base current will be seen to be a quantity ($i_e - i_c \cos \omega\tau$). Since $i_c$ equals $\alpha\ i_e$, that in-phase current value may instead be expressed:

$$i_e(1-\alpha \cos \omega\tau) \quad (6)$$

Consequently, the total in-phase voltage drop in the input circuit may be expressed:

$$i_e r_e + i_e(1-\alpha \cos \omega\tau)\ R_b \quad (7)$$

Dividing by the emitter current $i_e$, the total resistance $R$ is given by the relationship:

$$R = r_e + (1-\alpha \cos \omega\tau)\ R_b \quad (8)$$

Since the $Q$ is determined from the basic relationship WL/R, and the value of WL is $R_b|\alpha|\sin \omega\tau$ (from equation 4):

$$Q = R_b |\alpha| \sin \omega\tau / r_e + (1-\alpha \cos \omega\tau)\ R_b \quad (9)$$

or $$Q = |\alpha| \sin \omega\tau / 1 + (re/R_b) - \alpha \cos \omega\tau \quad (10)$$

From a comparison of equations (4) and (10), it will be appreciated that an increase in the current gain of the transistor results in an increase of both the apparent inductance and the $Q$. Similarly, both the inductance and the $Q$ may be increased by increasing the value of base resistor 27.

Transducer 12 is coupled in series combination with base resistor 27 in the input circuit of transistor 22. Output transducer 14 is similarly associated with transistor circuitry. That is, transducer 14 is coupled across the input circuit 40 of a transistor 41 that includes an emitter 42 and a base 43. A base resistor 44, that includes the internal base resistance as discussed above, is included in the input circuit. An output circuit 45 extends from a collector 46 through a bypass capacitor 47 and through resistor 44 to base 43. The input signal circuit 40 is shunted from emitter 42 through a resistor 48 and a direct-current source 49 back to base 43 through resistor 44. Collector 46 is reverse biased by a direct current source 50, while emitter 42 is forward biased by source 49.

In operation, the circuitry including transistor 41 functions similarly to transistor 22 to present an apparent inductance across the common base resistor 40 and, hence, in parallel with transducer 14. Generally speaking, the analysis of operation is the same as already carried out in connection with FIG. 3. Resistor 48 is included to enable control of the emitter current. Again noting that transistor 41 may be a tetrode, it will be observed that the total effective base resistance, of which resistor 44 is a part, can be modified by changing the current between the two bases of that kind of transistor.

As herein specifically shown, the arrangements are such that the inductance presented by the transistor is in parallel with the capacitance of the transducer. It will be apparent that the circuitry may be rearranged so that the simulated inductance is in series with the capacitance of the transducer as viewed from reference to the signal circuit of load 15. Whatever arrangement is chosen, the simulated inductance forms a resonant combination with the transducer capacitance at a specific frequency of the surface waves.

In any case, one basic advantage of the invention is that of obtaining the presentation of an inductive reactance across the transducer the value of which at the center frequency of the signals from source 10 may be equal to the clamped capacitance of the associated transducer. Simply by changing transistor current values, the shape of response curves may be varied. Preferably, all of the circuit components and the transistors themselves are formed by conventional integrated-circuit techniques directly or otherwise are mounted upon the surfaces of substrate 20 adjacent to transducers 12 and 14. Of course, in the present state of art, such integrated fabrication does not include the direct current power sources; they must still be separately provided and connected into the circuitry by means of external leads.

While particular embodiments of the present invention have been shown and described, it is apparent that changes and modifications may be made therein without departing from the invention in its broader aspects. The aim of the appended claims, therefore, is to cover all such changes and modifications as fall within the true spirit and scope of the invention.

I claim:

1. A surface wave integratable filter for coupling a source of signals having a predetermined center frequency to a load, comprising:

a piezoelectric substrate propagative of acoustic surface waves;

input and output transducer means respectively electrically coupled to said source and to said load and mechanically coupled to a surface of said substrate for respectively launching and receiving in said surface acoustic surface waves which represent said signals, at least one of said input and output transducer means comprising a pair of interleaved combs of electrically conductive electrodes presenting therebetween a predetermined clamped capacitance and having a Q of predetermined value;

transistor means supported on said substrate having an input signal circuit which includes said one of said transducer means and having an output signal circuit; and impedance means includes in said input signal circuit of said transistor means for establishing operational characteristics of said transistor means effective to present an inductive reactance at said center frequency of said signals which is substantially equal to the clamped capacitive reactance at said center frequency of the included one of said transducers, said impedance means having a Q value at said center frequency which is low relative to said Q value of the included one of said transducer means such that said transducer means primarily defines the selectivity of said filter.

* * * * *